United States Patent [19]
Kanemitsu et al.

[11] Patent Number: 5,814,814
[45] Date of Patent: Sep. 29, 1998

[54] ELECTRON MICROSCOPE

[75] Inventors: Yoichi Kanemitsu, Fukuoka-ken; Katsuhide Watanabe, Kanagawa-ken, both of Japan

[73] Assignee: Ebara Corporation, Tokyo, Japan

[21] Appl. No.: 607,613

[22] Filed: Feb. 27, 1996

[30] Foreign Application Priority Data

Feb. 28, 1995 [JP] Japan .................................. 7-065130

[51] Int. Cl.$^6$ ............................................... H01J 37/244
[52] U.S. Cl. .......................................... 250/310; 250/357
[58] Field of Search .................................. 250/309, 397, 250/310, 442.11, 491.11

[56] References Cited

U.S. PATENT DOCUMENTS

| | | | |
|---|---|---|---|
| 4,767,973 | 8/1988 | Jacobsen et al. | 318/652 |
| 4,929,874 | 5/1990 | Mizuno et al. | 318/128 |
| 4,948,971 | 8/1990 | Vogen et al. | 250/310 |
| 5,000,415 | 3/1991 | Sandercock | 248/550 |
| 5,049,745 | 9/1991 | Vogen et al. | 250/310 |
| 5,523,576 | 6/1996 | Koike et al. | 250/491.1 |

FOREIGN PATENT DOCUMENTS

| | | |
|---|---|---|
| 59-60854 | 4/1984 | Japan . |
| 2-61951 | 3/1990 | Japan . |
| 2-152152 | 6/1990 | Japan . |
| 4-169048 | 6/1992 | Japan . |

Primary Examiner—Bruce Anderson
Attorney, Agent, or Firm—Nikaido Marmelstein Murray & Oram LLP

[57] ABSTRACT

An electron microscope has an electron gun for emitting an electron beam, a specimen holder for holding a specimen thereon, and a deflection coil for applying the electron beam from the electron gun to the specimen on the specimen holder. A controller produces a differential signal representing the difference between a signal from a vibration sensor which detects vibrations of the electron gun and a signal from another vibration sensor which detects vibrations of the specimen holder. The differential signal is added to a deflection signal for the deflection coil for thereby effecting feedforward control of the electron beam to cause the electron beam to reach the specimen on the specimen holder, irrespective of the vibrations of the electron gun and the specimen holder.

3 Claims, 3 Drawing Sheets

ELECTRON MICROSCOPE

BACKGROUND OF THE INVENTION

1. Field of the Invention

The present invention relates to an electron microscope, and more particularly to an electron microscope for use in the inspection of integrated semiconductors for microstructural details and the observation of minute objects, the electron microscope being capable of generating images for observation at increased resolution.

2. Description of the Related Art

There have heretofore been available electron microscopes which have an electron gun for applying an electron beam to an object to be observed and an electromagnet that serves as a lens for deflecting the electron beam to produce a magnified image of the object. Such electron microscopes find wide use in the inspection of semiconductors for microstructural processing and the observation of minute objects. Basically, the electron microscopes are classified into scanning, transmission, and emission electron microscopes.

FIG. 3 of the accompanying drawings shows a conventional scanning electron microscope. As shown in FIG. 3, the conventional scanning electron microscope comprises an electron gun 2, a condenser lens 3, a deflection coil 4, and an objective lens 5, all of which are housed in a microscope column 1. An electron beam emitted from the electron gun 2 is converged by the condenser lens 3, the deflection coil 4, and the objective lens 5, and applied to a specimen placed on a specimen holder 6. Secondary electrons which are generated from the specimen at the point where the electron beam impinges on the specimen are detected by an electron collector 7, thereby generating a secondary-electron image of the specimen.

The scanning electron microscope shown in FIG. 3 is of a vertical structure mounted on an installation floor 9. The resolution of images observed by the scanning electron microscope tends to be lowered due to vibrations caused by the installation floor 9 and vibrations and sound of a vacuum pump which is connected to evacuate the interior of the microscope column 1. One solution has been to place the microscope column 1 incorporating the electron gun 2, the condenser lens 3, the deflection coil 4 and the objective lens 5 on a vibroisolating support device 8 which comprises an air spring or a vibroisolating body of rubber.

The microscope column 1 supported on the vibroisolating support device 8 has a natural frequency depending on the mass and moment of inertia of the microscope column 1. Because vibrations of the installation floor 9 are amplified due to the natural frequency of the microscope column 1, the scanning electron microscope fails to create images for observation at high resolution.

SUMMARY OF THE INVENTION

It is therefore an object of the present invention to provide an electron microscope which can generate images for observation at high resolution irrespective of vibrations of an installation floor on which the electron microscope is mounted.

According to a first aspect of the present invention, there is provided an electron microscope comprising an electron gun for emitting an electron beam, a specimen holder for holding a specimen thereon, a deflection coil for applying the electron beam from the electron gun to the specimen on the specimen holder, a first vibration sensor for detecting vibrations of the electron gun and producing a first signal representing detected vibrations of the electron gun, a second vibration sensor for detecting vibrations of the specimen holder and producing a second signal representing detected vibrations of the specimen holder, and a controller for adding a differential signal representing the difference between the first signal and the second signal to a deflection signal supplied to the deflection coil for thereby effecting feedforward control of the electron beam to cause the electron beam to reach the specimen on the specimen holder.

With the above arrangement, a differential signal representing the difference between vibrations of the electron gun and vibrations of the specimen holder is added to a deflection signal for the deflection coil to effect feedforward control of the electron beam to cause the electron beam to reach the specimen on the specimen holder, irrespective of the vibrations of the electron gun and the specimen holder. Therefore, in synchronism with vibratory movement of the specimen holder as viewed from the electron gun, the electron beam is shifted, i.e., the spot where the electron beam emitted from the electron gun impinges on the specimen is shifted, for thereby compensating for the vibrations of the electron gun and the specimen holder. The electron microscope can thus generate an image of the specimen, which may be a semiconductor or a minute object, for example, for observation at high resolution.

According to a second aspect of the present invention, there is provided an electron microscope comprising an electron gun for emitting an electron beam, a specimen holder for holding a specimen thereon, a deflection coil for applying the electron beam from the electron gun to the specimen on the specimen holder, sensing means for detecting vibrations of an installation floor for installing the electron microscope and producing a third signal representing detected vibrations of the installation floor, and a controller for generating a control signal representing relative vibrations between the electron gun and the specimen holder on the basis of the third signal and adding the control signal to a deflection signal for the deflection coil for thereby effecting feedforward control of the electron beam to cause the electron beam to reach the specimen on the specimen holder.

In one method of the second aspect of the present invention, the controller effects a convolution integral of the impulse response of a transfer function which is the difference between a vibration transfer function between the installation floor and the electron gun and a vibration transfer function between the installation floor and the specimen holder, and the third signal, and generates the control signal representing relative vibrations between the electron gun and the specimen holder.

In another method of the second aspect of the present invention, the controller computes the product of a transfer function which is the difference between a vibration transfer function between the installation floor and the electron gun and a vibration transfer function between the installation floor and the specimen holder, and the third signal, and generates the control signal representing relative vibrations between the electron gun and the specimen holder.

According to one method of the second aspect of the present invention, relative vibrations between the electron gun and the specimen holder are determined based on a convolution integral of the impulse response of a transfer function which is the difference between a vibration transfer function between the installation floor and the electron gun and a vibration transfer function between the installation floor and the specimen holder, and the third signal representing the vibrations of the installation floor. The signal obtained by the convolution integral, i.e., the signal representing the relative vibrations between the electron gun and the specimen holder, is added to a deflection signal for the deflection coil to effect feedforward control of the electron beam. Therefore, the electron beam emitted from the electron gun is controlled to reach the specimen, irrespective of the vibrations of the electron gun and the specimen holder. The electron microscope is thus free from the vibrations of the installation floor.

According to another method of the second aspect of the present invention, relative vibrations between the electron gun and the specimen holder are determined based on the product of a transfer function which is the difference between a vibration transfer function between the installation floor and the electron gun and a vibration transfer function between the installation floor and the specimen holder, and the third signal representing the vibrations of the installation floor. The signal obtained by the above computation, i.e., the signal representing the relative vibrations between the electron gun and the specimen holder, is added to a deflection signal for the deflection coil to effect feedforward control of the electron beam. Therefore, the electron beam emitted from the electron gun is controlled to reach the specimen, irrespective of the vibrations of the electron gun and the specimen holder. The electron microscope is thus free from the vibrations of the installation floor.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
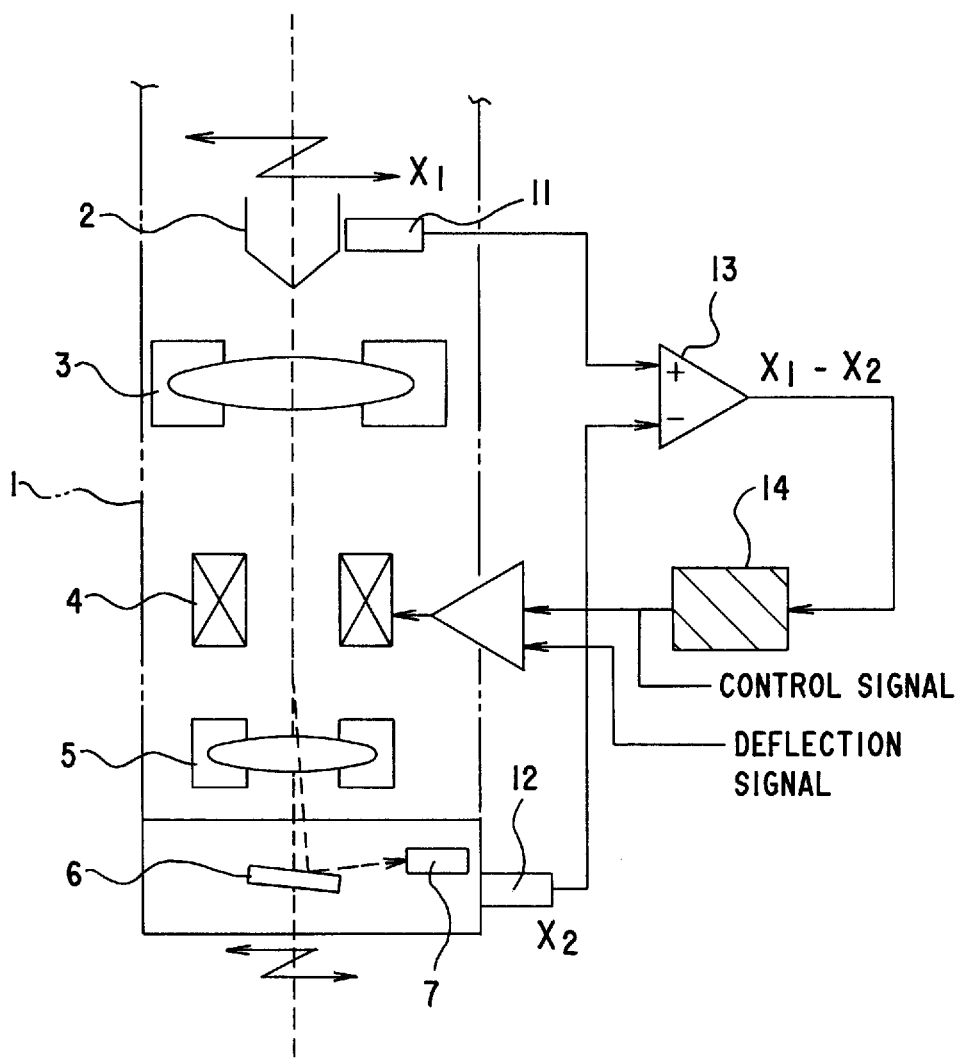
FIG. 1 is a schematic elevational view of an electron microscope according to a first embodiment of the present invention.

As shown in FIG. 1, an electron microscope according to a first embodiment of the present invention comprises an electron gun 2, a condenser lens 3, a deflection coil 4, an objective lens 5, a specimen holder 6, and an electron collector 7, all of which are housed in a microscope column 1. The electron gun 2 emits an electron beam which is converged by the condenser lens 3, the deflection coil 4, and the objective lens 5, and applied to a specimen placed on the specimen holder 6 that is positioned below the objective lens 5. The electron collector 7 is positioned near the specimen holder 6 for collecting secondary electrons which are emitted from the specimen at the point where the electron beam impinges on the specimen.

A vibration sensor 11 for detecting vibrations of the electron gun 2 and producing a vibration signal $X_1$ is associated with the electron gun 2. A vibration sensor 12 for detecting vibrations of the specimen holder 6 and producing a vibration signal $X_2$ is associated with the specimen holder 6.

The vibration sensors 11, 12 supply respective vibration signals $X_1$, $X_2$ to a differential amplifier 13 which outputs a differential signal $(X_1-X_2)$, representative of the difference between the signals $X_1$, $X_2$, to a controller 14. The controller 14 processes the differential signal $(X_1-X_2)$ according to a control process such as a PID (proportional plus integral plus derivative) control process, thereby producing a control signal. The controller 14 outputs the control signal that is added to a deflection signal for the deflection coil 4, and the resultant signal is applied to the deflection coil 4.

In operation, vibrations of the electron gun 2 and the specimen holder 6 are detected respectively by the vibration sensors 11, 12, which supply respective vibration signals $X_1$, $X_2$ to the differential amplifier 13. The differential amplifier 13 produces a differential signal $(X_1-X_2)$ from the signals $X_1$, $X_2$, and supplies the differential signal $(X_1-X_2)$ to the controller 14. The controller 14 generates a control signal from the differential signal $(X_1-X_2)$, and adds it to a deflection signal for the deflection coil 4 for feedforward control of the electron beam. Therefore, in synchronism with vibratory movement of the specimen holder 6 as viewed from the electron gun 2, the electron beam is shifted, i.e., the spot where the electron beam emitted from the electron gun 2 impinges on the specimen is shifted, for thereby compensating for the vibrations of the electron gun 2 and the specimen holder 6. The electron microscope can thus generate an image of the specimen, which may be a semiconductor or a minute object, for example, for observation at high resolution.

Figure 2:
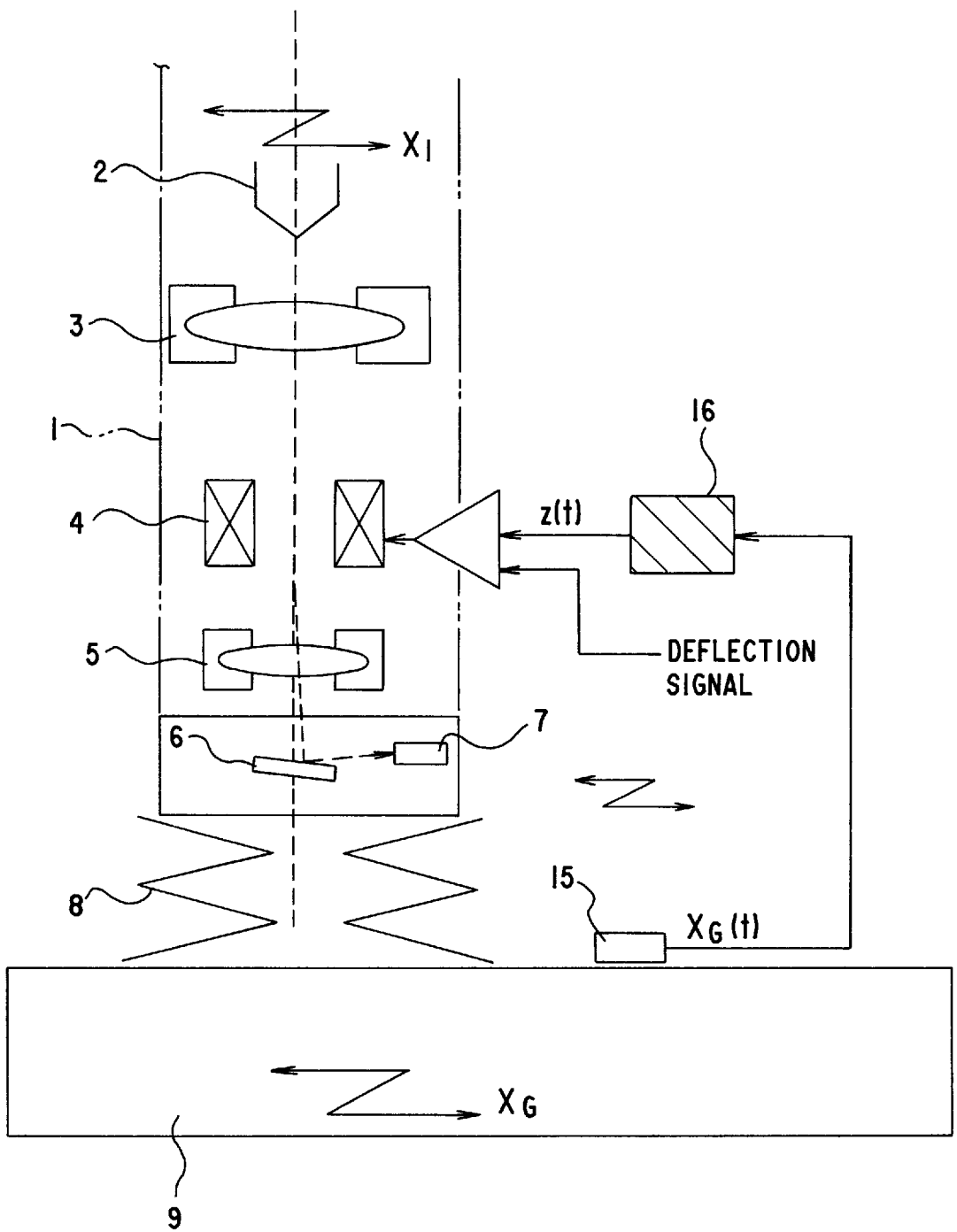
FIG. 2 is a schematic elevational view of an electron microscope according to a second embodiment of the present invention.
Figure 3:
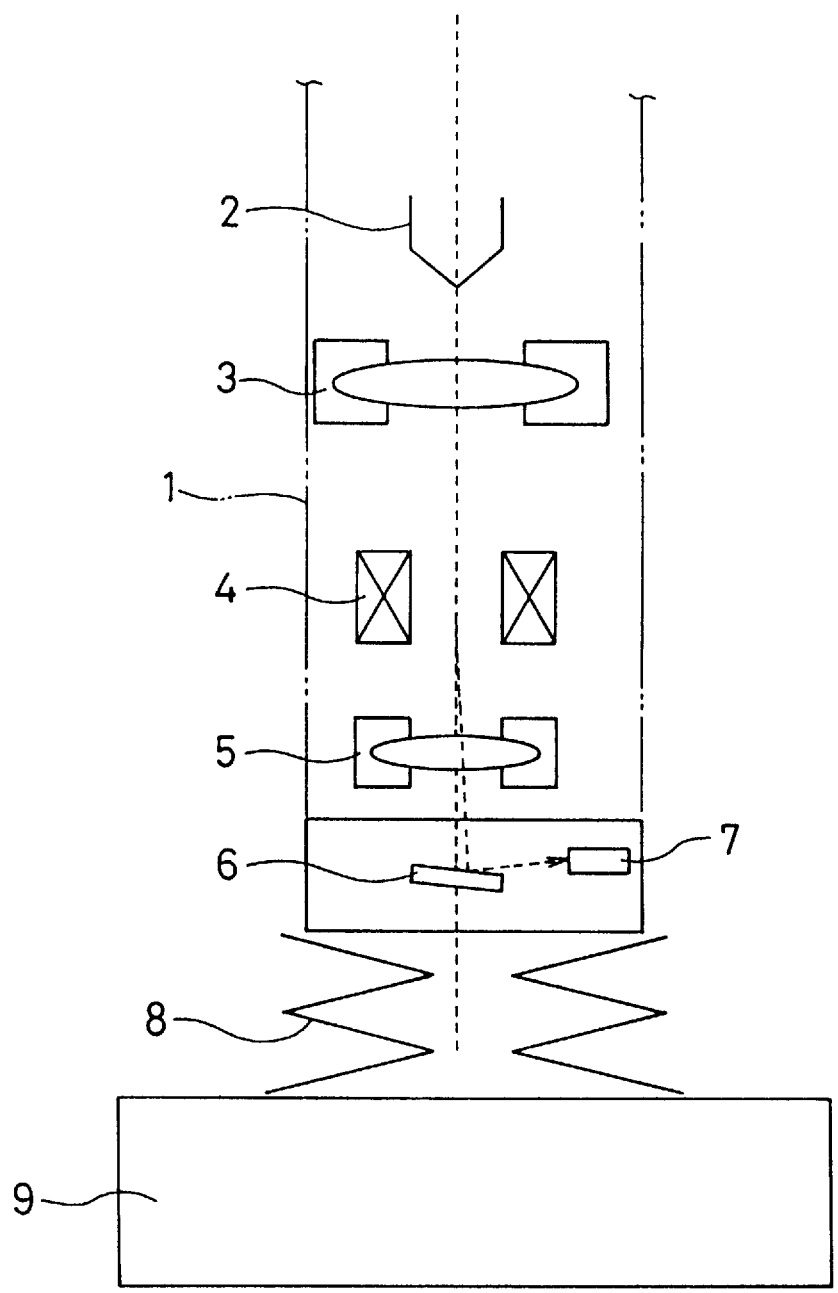
FIG. 3 is a schematic elevational view of a conventional scanning electron microscope.

FIG. 2 shows an electron microscope according to a second embodiment of the present invention.

As shown in FIG. 2, the electron microscope according to the second embodiment comprises an electron gun 2, a condenser lens 3, a deflection coil 4, an objective lens 5, a specimen holder 6, and an electron collector 7, all of which are housed in a microscope column 1. The microscope column 1 is mounted on an installation floor 9 by a vibroisolating device 8 such as an air spring or a vibroisolating body of rubber.

The installation floor 9 is associated with a vibration sensor 15 for detecting vibrations of the installation floor 9. The vibration sensor 15 supplies a signal $X_G(t)$ to a controller 16.

The controller 16 effects a convolution integral of the signal $X_G(t)$, which represents vibrations of the installation floor 9, according to the following equation:

$$y(t)=\int_0^t h(\tau)X_G(t-\tau)d\tau$$

where $h(\tau)=h_1(\tau)-h_2(\tau)$, with $h_1(\tau)$ representing the impulse response of the vibration between the installation floor 9 and the electron gun 2 and $h_2(\tau)$ representing the impulse response of the vibration between the installation floor 9 and the specimen holder 6.

Thereafter, the controller 16 processes $y(t)$ obtained by the convolution integral, according to a control process such as a PID control process, thereby producing a control signal $z(t)$. The control signal $z(t)$ is added to a deflection signal for the deflection coil 4, and the resultant signal is applied to the deflection coil 4.

In the second embodiment, relative vibrations between the electron gun 2 and the specimen holder 6 are determined based on a convolution integral of the impulse response of a transfer function which is the difference between a vibration transfer function between the installation floor 9 and the electron gun 2 and a vibration transfer function between the installation floor 9 and the specimen holder 6, and the signal $X_G(t)$ representing the vibrations of the installation floor 9.

The signal obtained by the convolution integral is added to a deflection signal for the deflection coil 4 for feedforward control of the electron beam. Therefore, the electron beam emitted from the electron gun 2 is controlled to reach the specimen, irrespective of the vibrations of the electron gun 2 and the specimen holder 6. The electron microscope is thus free from the vibrations of the installation floor 9.

Next, another method on the basis of the detected signal of the vibration sensor will be explained.

The detected signal $X_G(t)$ is inputted in the controller 16. In the controller 16, the following calculation is effected on the basis of the detected signal $X_G(t)$.

$$y(s)=G(s)\cdot X_G(s)$$

Here, in the case where the solution is assumed to be expressed by a complex number, the following equations are given.

$$y(t)=Ye^{j\omega t}, X_G(t)=Ae^{j\omega t}$$

Here, Y and A represent complex amplitudes, respectively. In case of using $G(j\omega)$ which substitutes S for $J\omega$, the following equation is given.

$$y(t)=G(j\omega)Ae^{j\omega t}$$

The steady-state vibrations y(t) is obtained from the real-number term and expressed by the following equation.

$$y(t)=|G(j\omega)|A\cos(\omega t-\phi)$$

Here, $|G(j\omega)|$ is an absolute value of a function of complex variable $G(j\omega)$, and $\phi$ the is amplitude of the function of complex variable $G(j\omega)$ and is expressed by the following equation.

$$\omega=-\angle G(j\omega)$$

Thereafter, the controller 16 processes y(t) obtained by the above calculation, according to a control process such as a PID control process, thereby producing a control signal z(t). The control signal z(t) is added to a deflection signal for the deflection coil 4, and the resultant signal is applied to the deflection coil 4.

According to the above method, the transfer function which is the difference between a vibration transfer function between the installation floor 9 and the electron gun 2 and a vibration transfer function between the installation floor 9 and the specimen holder 6 is obtained. From the product of the transfer function thus obtained, i.e. frequency transfer function and the signal $X_G(t)$ of the vibration sensor 15, relative vibrations between the electron gun 2 and the specimen holder 6 are determined. The signal obtained by the above calculation is added to a deflection signal for the deflection coil 4 for feedforward control of the electron beam. Therefore, the electron beam emitted from the electron gun 2 is controlled to reach the specimen, irrespective of the vibrations of the electron gun 2 and the specimen holder 6. The electron microscope is thus free from the vibrations of the installation floor 9.

Although certain preferred embodiments of the present invention have been shown and described in detail, it should be understood that various changes and modifications may be made therein without departing from the scope of the appended claims.

What is claimed is:

1. An electron microscope comprising:

an electron gun for emitting an electron beam;

a specimen holder for holding a specimen thereon;

a deflection coil for applying the electron beam from said electron gun to the specimen on said specimen holder;

a vibration sensor for detecting vibrations of said electron gun and producing a signal representing detected vibrations of said electron gun;

a vibration sensor for detecting vibrations of said specimen holder and producing a signal representing detected vibrations of said specimen holder;

means for combining said signals representing vibrations of said electron gun and said specimen holder to produce a differential signal representing a difference therebetween; and a controller for generating a control signal representing relative vibrations between said electron gun and said specimen holder on the basis of said differential signal and adding said control signal as a control signal to a deflection signal for said deflection coil for thereby effecting feedforward control of the electron beam to cause the electron beam to reach the specimen on said specimen holder.

2. An electron microscope comprising:

an electron gun for emitting an electron beam;

a specimen holder for holding a specimen thereon;

a deflection coil for applying the electron beam from said electron gun to the specimen on said specimen holder;

sensing means for detecting vibrations of an installation floor for installing said electron microscope and producing a signal representing detected vibrations of said installation floor; and a controller for generating a control signal representing relative vibrations between said electron gun and said specimen holder on the basis of said signal representing detected vibrations of said installation floor and adding said control signal to a deflection signal for said deflection coil for thereby effecting feedforward control of the electron beam to cause the electron beam to reach the specimen on said specimen holder, wherein said controller generates said control signal representing relative vibrations between said electron gun and said specimen holder by effecting a convolution integral of the impulse response of a transfer function and said signal representing detected vibrations of said installation floor, which transfer function is the difference between a vibration transfer function between said installation floor and said electron gun and a vibration transfer function between said installation floor and said specimen holder.

3. An electron microscope comprising:

an electron gun for emitting an electron beam;

a specimen holder for holding a specimen thereon;

a deflection coil for applying the electron beam from said electron gun to the specimen on said specimen holder;

sensing means for detecting vibrations of an installation floor for installing said electron microscope and producing a signal representing detected vibrations of said installation floor; and a controller for generating a control signal representing relative vibrations between said electron gun and said specimen holder on the basis of said signal representing detected vibrations of said installation floor and adding said control signal to a deflection signal for said deflection coil for thereby effecting feedforward control of the electron beam to cause the electron beam to reach the specimen on said specimen holder, wherein said controller generates said control signal representing relative vibrations between said electron gun and said specimen holder by computing the product of a transfer function and said signal representing detected vibrations of said installation floor, said transfer function being the difference between a vibration transfer function between said installation floor and said electron gun and a vibration transfer function between said installation floor and said specimen holder.

* * * * *